(12) United States Patent
Watanabe et al.

(10) Patent No.: US 6,569,812 B2
(45) Date of Patent: May 27, 2003

(54) METHOD FOR FABRICATING AN YTTRIUM-BASED HIGH TEMPERATURE SUPERCONDUCTING TAPE

(75) Inventors: Kazuo Watanabe, Iwanuma (JP); Mitsuhiro Motokawa, Sendai (JP)

(73) Assignee: Tohoku University, Sendai (JP)

( * ) Notice: Subject to any disclaimer, the term of this patent is extended or adjusted under 35 U.S.C. 154(b) by 0 days.

(21) Appl. No.: 09/995,409

(22) Filed: Nov. 26, 2001

(65) Prior Publication Data

US 2002/0169078 A1 Nov. 14, 2002

(30) Foreign Application Priority Data

May 10, 2001 (JP) .......................... 2001-139490

(51) Int. Cl.⁷ .................. H01L 39/24; C23C 14/28; B29C 35/08; B05D 1/36; B05D 7/00
(52) U.S. Cl. .................. 505/434; 505/473; 427/595; 427/598; 427/419.2
(58) Field of Search .................. 505/237, 430, 505/470, 473, 434, 730, 739; 427/585, 598, 599, 126.1, 126.2, 126.3, 399, 419.1, 419.2

(56) References Cited

U.S. PATENT DOCUMENTS

| | | | | |
|---|---|---|---|---|
| 4,939,121 A | * | 7/1990 | Rybka | 505/400 |
| 4,975,411 A | * | 12/1990 | Danby et al. | 505/400 |
| 4,980,338 A | * | 12/1990 | Yamazaki | 505/330 |
| 5,011,817 A | * | 4/1991 | Hidaka et al. | 505/171 |
| 5,162,296 A | * | 11/1992 | Yamazaki | 505/400 |
| 5,179,073 A | * | 1/1993 | Yamazaki | 505/480 |
| 5,258,364 A | * | 11/1993 | Yamazaki | 505/400 |
| 5,262,396 A | * | 11/1993 | Yamazaki | 505/400 |
| 5,284,779 A | * | 2/1994 | Miyanaga | 117/84 |
| 6,110,542 A | * | 8/2000 | Miyanaga et al. | 427/577 |
| 2002/0142163 A1 | * | 10/2002 | Mino et al. | 428/403 |

FOREIGN PATENT DOCUMENTS

JP  3551352535 A  * 10/1980

* cited by examiner

Primary Examiner—Tom Dunn
Assistant Examiner—Colleen P. Cooke
(74) Attorney, Agent, or Firm—Stoel Rives LLP

(57) ABSTRACT

A polycrystalline silver member is stuck on a given long member made of Hastelloy material or stainless steel material, to make a long base material. Then, an yttrium-based high temperature superconducting film is fabricated in the long base material by a CVD method with applying a magnetic field of preferable 2T or over. Thereby, an yttrium-based high temperature superconducting tape can be provided which can maintain the superconductivity under a higher magnetic field environment.

9 Claims, 2 Drawing Sheets

METHOD FOR FABRICATING AN YTTRIUM-BASED HIGH TEMPERATURE SUPERCONDUCTING TAPE

BACKGROUND OF THE INVENTION

1. Field of the Invention

This invention relates to a method for fabricating an yttrium-based high temperature superconducting tape, particularly to a method for fabricating an yttrium-based high temperature superconducting tape preferably usable for a superconducting motor, a superconducting electric generator, an electromagnetic ship, a superconducting linear transportation and a superconducting power applied instrument such as a superconducting magnet for materials science.

2. Description of the Prior Art

Recently, intense research and development have been carried out for obtaining a high temperature superconducting material, and as a result, an yttrium-based high temperature superconducting material such as $YBa_2Cu_3O_7$ and a bismuth-based high temperature superconducting material such as $Bi_2Sr_2Ca_2Cu_3O_{10}$ have been developed. Since such high temperature superconducting materials have their respective critical temperatures higher than the boiling point of liquid nitrogen, they can exhibit their respective superconducting properties using liquid nitrogen. As a result, such a high temperature superconducting material is expected for various industrial uses.

In the case of applying the above-mentioned high temperature superconducting material to a product to be used in a strong magnetic field, the magnitude of a magnetic field to maintain the superconducting property of the superconducting material is an important factor, and it is desired that the superconducting material can maintain the superconducting property in a strong magnetic field.

When a higher magnetic field is applied to the bismuth-based high temperature superconducting material at a higher temperature, the superconducting material can not maintain the superconducting property. Therefore, for using the bismuth-based high temperature superconducting material in a higher magnetic field, the superconducting material is required to be cooled down to a temperature of 20K or below. On the other hand, an yttrium-based high temperature superconducting material can maintain the superconducting property at a higher temperature under a strong magnetic field, so that it is expected for various applications such as a superconducting magnet and so on.

In the case of employing such a high temperature superconducting material as a product to be used in a strong magnetic field such as a superconducting magnet, it is required to be fabricated as a long-length wire. Since the yttrium-based high temperature superconducting material has small anisotropy, the superconducting property of the material may be degraded largely through the grain boundary-weak binding due to the slight slippage of the orientation when the superconducting material is drawn and two-axially oriented. Therefore, although the yttrium-based high temperature superconducting material can have the superconducting property at a higher temperature in itself, the yttrium-based superconducting material can not be used in a practical use, for example, a superconducting magnet.

Attempt is made to deposit the yttrium-based high temperature superconducting material as follows: First of all, a two-axially oriented buffer layer is formed on a Hastelloy tape by ion-beam technique, and then, a two-axially oriented yttrium-based high temperature superconducting film is formed on the buffer layer, to fabricate a deposited and oriented yttrium-based high temperature superconducting tape. Another attempt is made as follows: First of all, a two-axially oriented buffer layer is made on a nickel tape oriented by a cold-working method of so-called "RABITS", and then, a two-axially oriented yttrium-based high temperature superconducting film is formed on the buffer layer by the same manner as mentioned above, to fabricate a deposited and oriented yttrium-based high temperature conducting tape.

However, since those fabricating methods are very complicated, it is difficult to fabricate even a shorter yttrium-based high temperature superconducting tape. As of now, a longer deposited and superconductivity-maintaining at high degree yttrium-based high temperature conducting film can not be fabricated, so that can not be used in a high magnetic field product such as a superconducting magnet.

SUMMERY OF THE INVENTION

It is an object of the present invention to provide a method for fabricating a longer deposited yttrium-based high temperature superconducting tape usable for a high magnetic field product such as a superconducting magnet.

For achieving the above object, this invention relates to a method for fabricating an yttrium-based high temperature superconducting tape, including the steps of preparing a given long member, sticking a non-oriented long silver member on the long member, to make a long base material, and fabricating an yttrium-based high temperature superconducting film by a CVD method with applying a given magnetic field to he film.

In the fabricating method of the present invention, since the non-oriented long silver member serves as an underlayer for the yttrium-based high temperature superconducting film to be made non-orientation, and the yttrium-based high temperature superconducting film is made by a CVD method under a given magnetic field, the yttrium-based high temperature superconducting material is easily oriented in the c-axis along the direction of the applied magnetic field.

Moreover, the magnetic field application enables the crystalline grains to be made smaller and the grain boundary-weak binding to be degraded, so that the resulting yttrium-based high temperature superconducting film can exhibit the superconducting property even at the polycrystal condition, and thus, can be used for a product to be used in a strong magnetic field such as a superconducting magnet. As a result, the natural property of the yttrium-based high temperature superconducting material of the superconductivity being able to be maintained at a higher temperature and a higher magnetic field can be given to a practical product made of the material.

In a preferred embodiment of the present invention, the surface of the long silver member is mirror-polished before the yttrium-based high temperature superconducting film is made. In this case, the orientation of the superconducting film can be more enhanced.

In another preferred embodiment of the present invention, a calcium-including yttrium-based high temperature superconducting film, in which calcium elements are partially substituted for yttrium elements, is formed on the yttrium-based high temperature superconducting film, and then, thermally treated. In this case, the electron concentration in the grain boundaries of the yttrium-based high temperature superconducting film can be developed by the calcium elements of the calcium-including yttrium-based high temperature superconducting film, and thus, the electrical insulating property between the grain boundaries can be weakened.

As a result, the critical current property of the yttrium-based high temperature superconducting tape of the present invention can be largely developed.

BRIEF DESCRIPTION OF THE DRAWINGS

For better understanding of the present invention, reference is made to the attached drawings, wherein.

DESCRIPTION OF THE PREFERRED EMBODIMENTS

Figure 1A:
FIG. 1 is a photograph showing the crystal structure of a $YBa_2Cu_3O_7$ superconducting film fabricated according to the present invention.
Figure 1B:
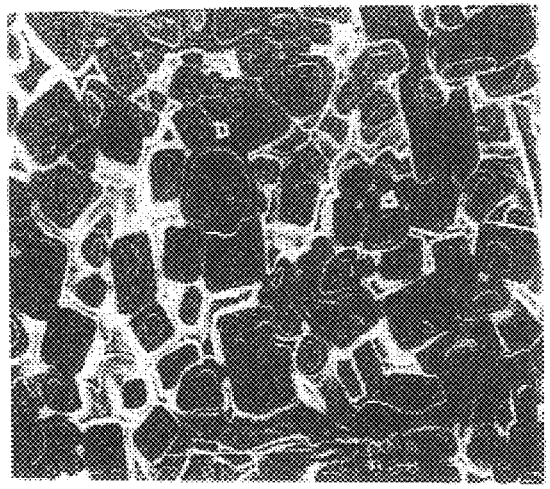
Figure 1C:
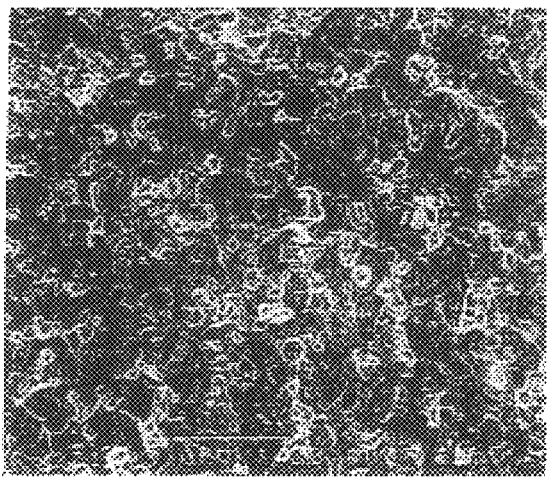
Figure 1D:
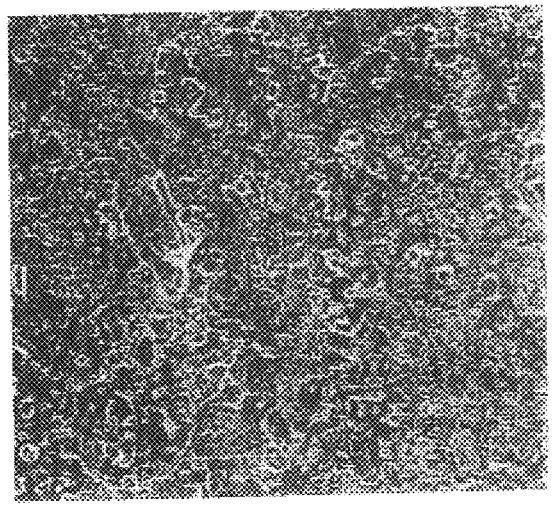

This invention will be described in detail with reference to the accompanying drawings.

In the fabricating method of the present invention, a long base material, composed of a given long member and a non-oriented long silver member made and stuck on the long member, is employed. The long silver member serves as an underlayer for an yttrium-based high temperature superconducting film to be made, and is required to be non-oriented, as mentioned above.

Therefore, the long silver member is required to be polycrystal or amorphous. Preferably, the polycrystalline silver member is employed because it is cheap and easily available.

In the case of making the long silver member of such a polycrystalline member, the thickness of long silver member is preferably set within 5–50 μm, particularly within 5–10 μm. In this case, the long silver member exhibits the function of a non-oriented underlayer effectively, to enhance the space current density of the yttrium based high temperature superconducting film to be made later.

As mentioned above, it is desired that the surface of the long silver member is mirror-polished. In this case, the long silver member exhibits the function of a non-oriented underlayer more effectively, and thus, the orientation of the yttrium-based high temperature superconducting film to be made by a CVD method under a given magnetic field can be enhanced. The mirror polishing may be carried out by a publicly known mirror polishing method.

The kind of the long member on which the long silver member is made and stuck is not restricted, but it is desired that the long member is made of Hastelloy or stainless steel. Since these materials have larger strengths and higher oxidation-proofs, the resulting yttrium-based high temperature conducting tape can have a higher environmental condition-proof, and thus, can be used in under a cruel condition.

Moreover, it is desired that the long silver member is stuck on the long member with cladding. In this case, the long silver member can be stuck on the long member easily and tightly, and can not be brought away from on the long member even though the resulting yttrium-based high temperature superconducting film is used under a cruel condition.

In the fabricating method of the present invention, an yttrium-based high temperature superconducting film is formed on the long base material, composed of the long member and the long silver member stuck on the long member, under a given magnetic field by a CVD method. Particularly, a thermal CVD method may be employed in which given raw material gases are reacted on the long base member.

If the yttrium-based high temperature superconducting film is fabricated by a thermal CVD method, the long base material is heated and thus, the yttrium-based high temperature superconducting film becomes fluid to some degrees. As a result, the orientation of the resulting superconducting film can be enhanced by the magnetic field application. Concretely, during the thermal CVD process, the long base material is preferably heated within 700–850° C., particularly within 750–800° C.

In the thermal CVD fabrication of the yttrium-based high temperature superconducting film, the magnitude of the magnetic field to be applied is preferably set to 2T or over. By applying such a high magnetic field, the crystal grains of the yttrium-based high temperature superconducting film can be made smaller and the grain boundary-weak binding can be repressed, to enhance the critical current property.

In the present invention, the yttrium-based high temperature superconducting film may be made of a superconducting material having a composition of $YBa_2Cu_3O_7$, for example. Moreover, it may be of a Yb-substituted $YBa_2Cu_3O_7$ superconducting material in which Yb elements are partially substituted for Y elements. Furthermore, it may be of a rare earth metal substituted $YBa_2Cu_3O_7$ superconducting material in which rare earth metal elements are partially substituted for Y elements.

Therefore, as raw material gases for such an yttrium-based high temperature superconducting film in a thermal CVD method, $Y(DPM)_3$, $Ba(DPM)_2$, $Cu(DPM)_2$ or $Yb(DPM)_3$ are exemplified.

As mentioned above, in the fabricating method of the present invention, it is desired that a calcium-including yttrium-based high temperature superconducting film, in which calcium elements are partially substituted for yttrium elements, is formed on the yttrium-based high temperature superconducting film, and thereafter, thermally treated. In this case, the calcium elements diffuse into the crystal grain boundaries of the yttrium-based high temperature superconducting film and increase the electron concentration at the grain boundaries, to weaken the electric insulation between the grain boundaries.

As a result, the critical current property of the yttrium-based high temperature superconducting film fabricated according to the present invention can be developed.

Moreover, it is desired that a protective layer is provided on the outer side of the yttrium-based high temperature superconducting film, opposed to the long silver member via the superconducting film. In this case, external damage for the superconducting film can be prevented and thus, the superconductivity of the superconducting film can be maintained satisfactorily for a long time.

In the case that the calcium-including yttrium-based high temperature superconducting film on the yttrium-based high temperature superconducting film, the protective film is provided on the outer side of the calcium-including superconducting film.

The protective film is preferably made of silver material. In this case, the yttrium-based high temperature superconducting film is sandwiched by the long silver member and the silver protective film, and thus, sheathed by the same silver material.

EXAMPLE

A silver tape having a thickness of 40 μm was stuck with lining on a Hastelloy long member having a thickness of 0.1 mm and a width of 5 mm, to make a long base material. Then, the surface of the silver tape was mirror-polished and then, the long base material was heated to 850° C. Then, $Y(DPM)_3$, $Ba(DPM)_2$, and $Cu(DPM)_2$ were introduced onto the long base material as raw material gases, and a $YBa_2Cu_3O_7$ film was fabricated in a thickness of 1 μm on the long base material under a given magnetic field. In this case, the magnetic field to be applied was varied five steps of 0T, 2T, 4T, 6T and 8T.

Figure 2:
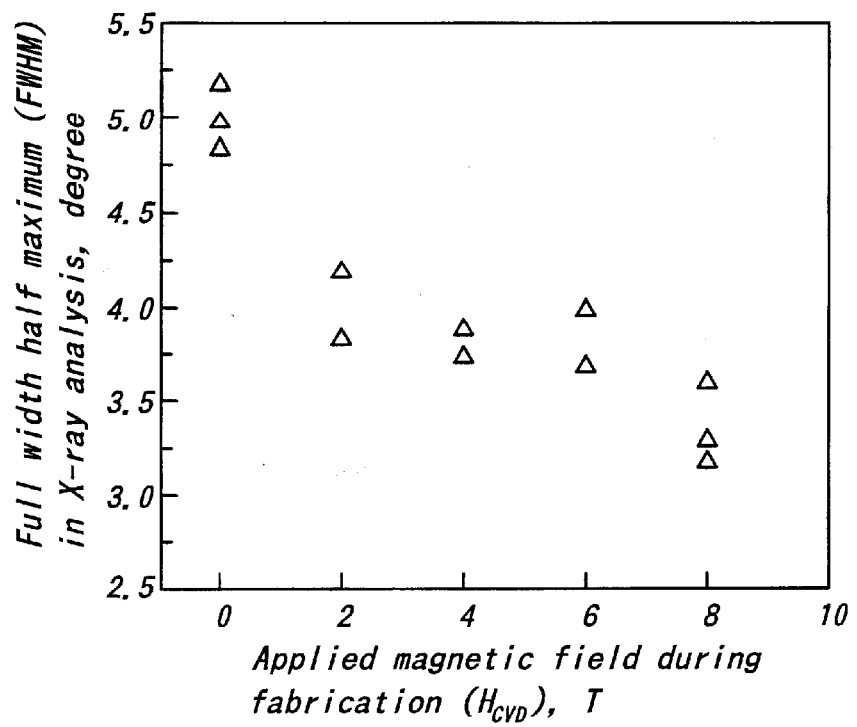
FIG. 2 is a graph showing the relation between the full width at half maximum (FWHM) in X-ray analysis of the (006) reflection of the $YBa_2Cu_3O_7$ superconducting film fabricated according to the present invention and the magnitude of the applied magnetic field during the fabrication of the $YBa_2Cu_3O_7$ superconducting film.

FIG. 1 is a photograph showing the crystal structure of the $YBa_2Cu_3O_7$ film. FIG. 1(a) shows the crystal structure of the $YBa_2Cu_3O_7$ film fabricated at 0T, and FIG. 1(b) shows the crystal structure of the $YBa_2Cu_3O_7$ film fabricated at 2T. FIG. 1(c) shows the crystal structure of the $YBa_2Cu_3O_7$ film fabricated at 4T, and FIG. 1(d) shows the crystal structure of the $YBa_2Cu_3O_7$ film fabricated at 8T. FIG. 2 is a graph showing the full width at half maximum (FWHM) in X-ray analysis of the (006) reflection of the $YBa_2Cu_3O_7$ film, depending on the magnitude of the applied magnetic field.

As is apparent from FIG. 1, at 0T of the applied magnetic field, the $YBa_2Cu_3O_7$ film is not almost oriented and has extremely large crystal grains. As is apparent from FIG. 2, at 0T of the applied magnetic field, the FWHM is very large and the $YBa_2Cu_3O_7$ film does not have satisfactory crystallinity.

Moreover, as is apparent from FIG. 1, the sizes of the crystal grains become smaller as the magnitude of the applied magnetic field is increased. Then, as is apparent from FIG. 2, the crystallinity and the orientation degree of the $YBa_2Cu_3O_7$ film are developed as the magnitude of the applied magnetic field.

Figure 3:
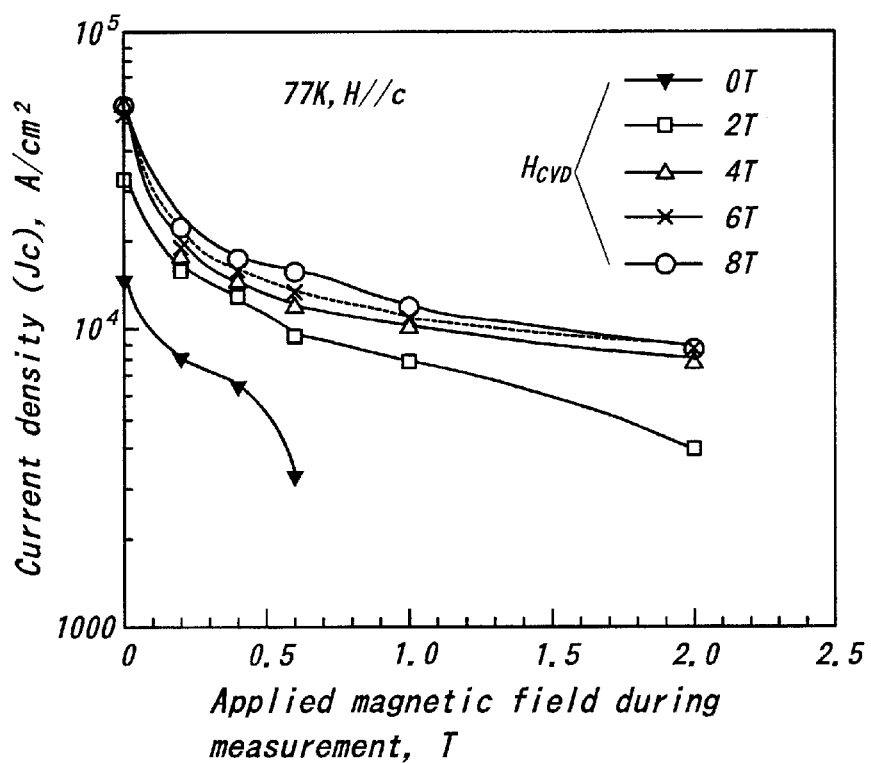
FIG. 3 is a graph showing the relation between the current density of the $YBa_2Cu_3O_7$ superconducting film fabricated according to the present invention and the magnitude of the applied magnetic field during the fabrication of the $YBa_2Cu_3O_7$ superconducting film.

FIG. 3 is a graph showing the relation between the current density of the $YBa_2Cu_3O_7$ film and the magnitude of the applied magnetic field at 77K. The current density of the $YBa_2Cu_3O_7$ film fabricated at 0T of the applied magnetic field is remarkably decreased as the magnitude of the measuring magnetic field is increased. Therefore, the $YBa_2Cu_3O_7$ film can not maintain the satisfactory superconductivity under a given magnetic field.

On the other hand, the current densities of the $YBa_2Cu_3O_7$ films fabricated at 2T or over, particularly 4T or over of the applied magnetic field are slightly decreased as the magnitude of the measuring magnetic field is increased. Therefore, the $YBa_2Cu_3O_7$ films can maintain their respective superconductivities satisfactorily.

As a result, it is clear that the $YBa_2Cu_3O_7$ films can be preferably used for products to be used under a higher magnetic field such as superconducting magnets.

Although the present invention was described in detail with reference to the above examples, this invention is not limited to the above disclosure and every kind of variation and modification may be made without departing from the scope of the present invention.

As is explained above, according to the fabricating method of the present invention, an yttrium-based high temperature superconducting tape is preferably usable for a product to be used under a higher magnetic field environment such as a superconducting magnet.

What is claimed is:

1. A method for fabricating an yttrium-based high temperature superconducting tape, comprising the steps of:
   preparing a given long member,
   sticking a non-oriented long silver member on the long member, to make a long base material, and
   fabricating an yttrium-based high temperature superconducting film by a CVD method with applying a given magnetic field to the film.

2. A fabricating method as defined in claim 1, wherein the long silver member is made of a silver polycrystalline material.

3. A fabricating method as defined in claim 2, wherein the thickness of the long silver member is set within 5–50 μm.

4. A fabricating method as defined in claim 1, further comprising the step of mirror-polishing the surface of the long silver member before the yttrium-based high temperature superconducting film is fabricated on the long base material.

5. A fabricating method as defined in claim 1, wherein the long silver member is stuck on the long member with lining.

6. A fabricating method as defined in claim 1, wherein the long member is made of a Hastelloy material or a stainless steel.

7. A fabricating method as defined in claim 1, wherein in the fabrication of the yttrium-based high temperature superconducting film by the CVD method, the long base material is heated within 700–850° C.

8. A fabricating method as defined in claim 1, wherein the fabrication of the yttrium-based high temperature superconducting film by the CVD method, a magnetic field of 2T or over is applied to the superconducting film.

9. A fabricating method as defined in claim 1, wherein a protective film is provided on the outer side of the yttrium-based high temperature superconducting film, opposed to the long silver member via the superconducting film.

* * * * *